Figure 1:
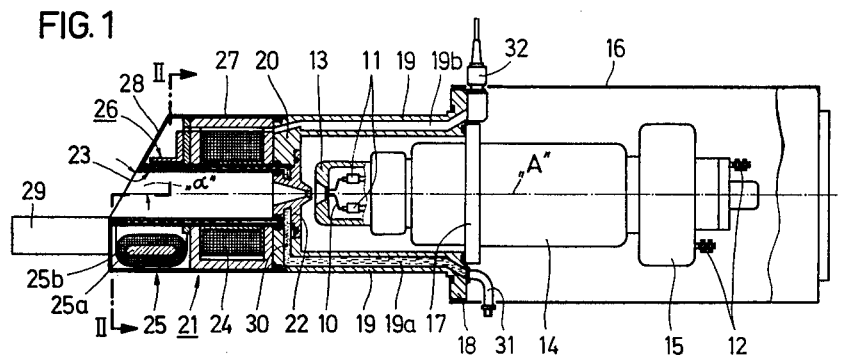

United States Patent [19]

Sommerkamp et al.

[11] 4,061,871
[45] Dec. 6, 1977

[54] ELECTRON GUN FOR HEATING, MELTING AND VAPORIZING PURPOSES, WITH DEFLECTION SYSTEMS

[75] Inventors: Peter Sommerkamp, Hanau am Main; Walter Heil, Neuberg, both of Germany

[73] Assignee: Leybold-Heraeus GmbH & Co. KG, Cologne, Germany

[21] Appl. No.: 681,634

[22] Filed: Apr. 29, 1976

[30] Foreign Application Priority Data

May 2, 1975 Germany .............................. 2519537

[51] Int. Cl.[2] .......................................... H01J 37/305
[52] U.S. Cl. .................................. 13/31; 219/121 EB
[58] Field of Search ................. 219/121 EB, 121 EM; 13/31

[56] References Cited
U.S. PATENT DOCUMENTS

| | | | |
|---|---|---|---|
| 3,312,858 | 4/1967 | Dietrich | 219/121 EB |
| 3,360,600 | 12/1967 | DuBois | 219/121 EB |
| 3,379,819 | 4/1968 | Houde | 13/31 |
| 3,388,235 | 6/1968 | Pinsley et al. | 219/121 EB |
| 3,652,821 | 3/1972 | Dietrich et al. | 219/121 EB |

Primary Examiner—R. N. Envall, Jr.
Attorney, Agent, or Firm—Burgess, Dinklage & Sprung

[57] ABSTRACT

Electron gun for heating, melting and vaporizing purposes having an electron-emitting cathode, at least one beam-forming electrode associated with the cathode, an accelerating anode, an electromagnetic lens and a beam guiding-tube extending in the direction of the beam path and surrounded by an electromagnetic deflection system for the x-axis deflection and one for the y-axis deflection. An envelope tube is disposed outside of the deflection systems and is joined at its extremity to the end of the beam guiding tube by an end plate through which the pole shoes of the x-axis deflection system are brought. The end plate is inclined towards the cathode beginning from the pole shoes of the x-axis deflection system.

8 Claims, 6 Drawing Figures

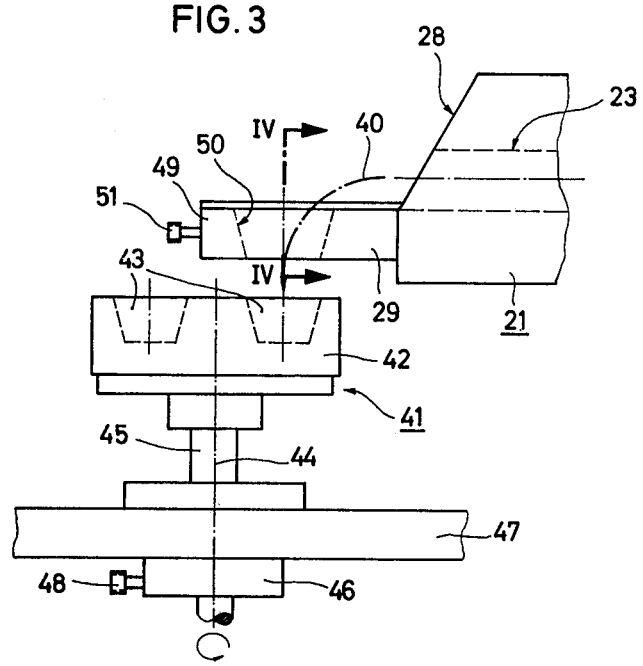
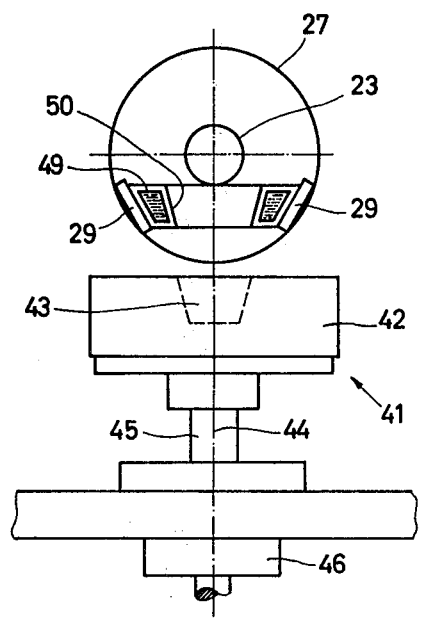

ELECTRON GUN FOR HEATING, MELTING AND VAPORIZING PURPOSES, WITH DEFLECTION SYSTEMS

BACKGROUND

The invention relates to an electron gun for heating, melting and vaporizing purposes, having an electron emitting cathode, at least one beam-forming electrode associated with the cathode, an accelerating anode, an electromagnetic lens, and a beam guiding tube extending in the direction of the beam path and surrounded by one electromagnetic deflection system for the x-axis deflection and one for the y-axis deflection, an envelope tube being disposed outside of the deflection system and being connected at its extremity by an end plate to the extremity of the beam guiding tube, the pole shoes of the x-axis deflection system being carried through the said end plate.

German Pat. No. 1,248,175 describes an electron gun of the kind described above, but one which has only one deflection system, in which the end plate, which is not further specified in said patent, is aligned perpendicularly to the longitudinal axis of the gun between the envelope tube or sleeve and the beam guiding tube. This known apparatus did result in a considerable improvement of the gun systems existing at the time; it is nevertheless in need of improvement. For example, the magnetic fields which inevitably occur between the pole pieces of the deflection system result in a perceptible deflection of the electron beam, so that, under unfavorable circumstances, i.e., in the event of a great beam deflection and less than optimum focusing, an incipient fusing has been observed in the discharge orifice, i.e., in the beam guiding tube and in the end plate. Attempts to diminish the magnetic fields at this point by means of an iron ring have not produced the desired success. In the known apparatus, furthermore, the end plate is undesirably heated by the radiant heat emitted by the heated material and also by reflected electrons. When the known electron gun is used for vaporizing purposes and the vaporizing crucible is located in the immediate vicinity of the end of the gun, vapor coating of the end plate has furthermore been observed. This is to be attributed to the fact that the stream of vapor assumes a conical or lobar shape on emerging from the vaporizing crucible, i.e., it diverges upwardly, and thus impinges upon the end plate of the gun system. Upon reaching a certain thickness of build-up at the gun orifice, the material peels off, thereby creating the considerable danger that the material might fall into the vaporizing crucible and contaminate the vaporization material contained therein. This disadvantage is particularly important because different materials have to be vaporized, depending on the application, and they must not be mixed with one another.

THE INVENTION

The invention therefore is addressed to the problem of improving the initially described electron gun such that the depositing of vapor and/or any additional heating of the end plate forming the gun orifice will reliably be prevented, or at least will be greatly diminished.

The solution of the problem set forth above is accomplished by the present invention in that the end plate, beginning at the pole shoes of the x-axis deflection system, is constructed with an inclination toward the cathode. To put it more simply, in terms of the customary disposition of such a gun, the end plate slants rearwardly away from the pole shoes.

The solution proposed by the invention offers the advantage that the thermal stress on the gun orifice from the radiant heat from the heated material is substantially reduced. When the gun of the invention is used for vapor depositing purposes, the formation of the vapor lobe is no longer interfered with by the gun orifice, so that no appreciable amounts of the vapor can condense on the gun orifice. Thus, the danger that material condensed on the gun orifice might fall into the vaporizing crucible is also considerably reduced.

The angle of inclination $\alpha$ of the end plate with reference to the axis of the beam guiding tube amounts to from 30° to 80°, preferably 45° to 70°, it being desirable to give the end plate the greatest possible inclination from the vertical while still assuring that the electromagnetic lens between the envelope tube and the beam guiding tube, as well as the electromagnets for the two deflection systems, can be accommodated at this point.

An additional improvement is achieved by arranging the yoke, the pole pieces, the coil and the pole shoes of the x-axis deflection system on one side of a plane of symmetry passing through the beam guiding tube. In terms of the usual spatial arrangement of the electron gun, this means that the plane of symmetry is horizontal and that the above-named components are disposed below this plane of symmetry, i.e., at a point to which the envelope tube and beam guiding tube extend farthest toward the pole shoe of the x-axis deflection system. This off-center arrangement of the x-axis deflection system prevents the yoke from surrounding the beam guiding tube in the manner of a ring from which the two pole pieces extend parallel to the beam guiding tube to the pole shoes, as is the case in the subject of German Pat. No. 1,248,175. By eliminating a ferromagnetic core of this kind, the yoke can be located in closer proximity to the gun orifice, thereby largely preventing any premature deflection of the beam within the beam guiding tube. In this manner, also, any undesired melting of the gun orifice, i.e., of the end plate and beam guiding tube, is reliably prevented.

The excentric arrangement of the x-axis deflection system as described above, especially in combination with the features of the principal claim, results in an especially advantageous solution, since the excentric arrangement of the x-axis deflection system and the sloping end plate at the gun orifice complement one another such that an optimum utilization of space within the envelope tube is made possible on the one hand, along with a substantially interference-free guidance of the electron beam all the way to the vicinity of the pole shoes.

An advantageous improvement of the subject matter of the invention is characterized by the fact that the pole shoe surfaces from which the lines of force emerge are disposed parallel to tangents of the envelope tube and enclose an angle between 20° and 90°, preferably between 45° and 70°. In this manner a V-shaped arrangement of the pole shoe surfaces is achieved, which makes possible a great beam deflection in a minimum of space.

The construction of the electron gun in accordance with the invention also permits the accommodation of a y-axis deflection system which is characterized, in accordance with the further invention, by the fact that it consists of a ferromagnetic, closed frame surrounding the beam guiding tube and having two cores disposed substantially at right angles to the x-axis deflection system and having induction coils mounted on them, and that the frame members between the cores are constructed so that they project forward towards the orifice of the beam guiding tube, the length of the projections, which form the pole shoes, being coordinated with the slope of the end plate. The y-axis deflection system is fitted virtually entirely into the space left unoccupied by the x-axis deflection system on the basis of its excentric arrangement in accordance with the features of construction described above, and is likewise located in the immediate adjacency of the gun orifice. At the same time, long pole pieces extending to the pole shoes can be dispensed with, since the induction coils are mounted directly on the closed ferromagnetic frame. In this manner the electron beam is not affected or deflected until it reaches the final portion of its course through the beam guiding tube, so that melting of the gun orifice is reliably prevented also by this measure.

In the subject matter of German Pat. No. 1,248,175, a cooling medium (water) is made to flow through the space between the envelope tube and the beam guiding tube, in which the electromagnetic lens and the coils of the deflection system are located, for the purpose of preventing these coils from overheating. This requires a corresponding encapsulation of the coils, since the cooling medium would otherwise destroy the insulation and corrode the terminals. The compact design of the present invention additionally makes it possible to make the beam guiding tube a jacketed tube provided with connections for a cooling medium. If this is done, the cooling medium will be circulated only through the beam guiding tube jacket, while the induction coils of the lens and of the deflection systems can be disposed in a part of the envelope tube through which coolant does not flow. In this manner the reliability of operation of the electron gun is further improved.

The V-shaped attitude of the pole shoes complies with the requirement that a vaporizing crucible be suspended on them so as to make contact with them over a broad surface. It is necessary only to provide the outer walls of the crucible with slanting surfaces enclosing an angle to match the angle enclosed by the pole shoes. Since the crucible is, as a rule, liquid-cooled, an effective cooling of the pole shoes is accomplished in this manner.

On the other hand, it is also possible to provide the crucible with ferromagnetic sides designed and disposed such that they form the prolongation of the pole shoes of the electron gun. By means of a permanent magnet disposed between these sides, an additional deflection magnet system is formed permitting beam guidance in the crucible area. The pole shoes of the electron gun can in this case be made shorter.

Instead of the vaporizing crucible, a water-cooled, copper shield can be suspended between the pole shoes disposed in the V-shaped arrangement, this shield containing an aperture, and being disposed as a spray shield above a rotatable vaporizing crucible provided with a plurality of cups. The shield serves simultaneously as a means of capturing a portion of the reflected electrons.

An example of the embodiment of the invention will now be described with reference to FIGS. 1 to 6, together with details relating thereto, the manner of its operation, and variants thereof, and a variety of possibilities for its application.

Figure 2:
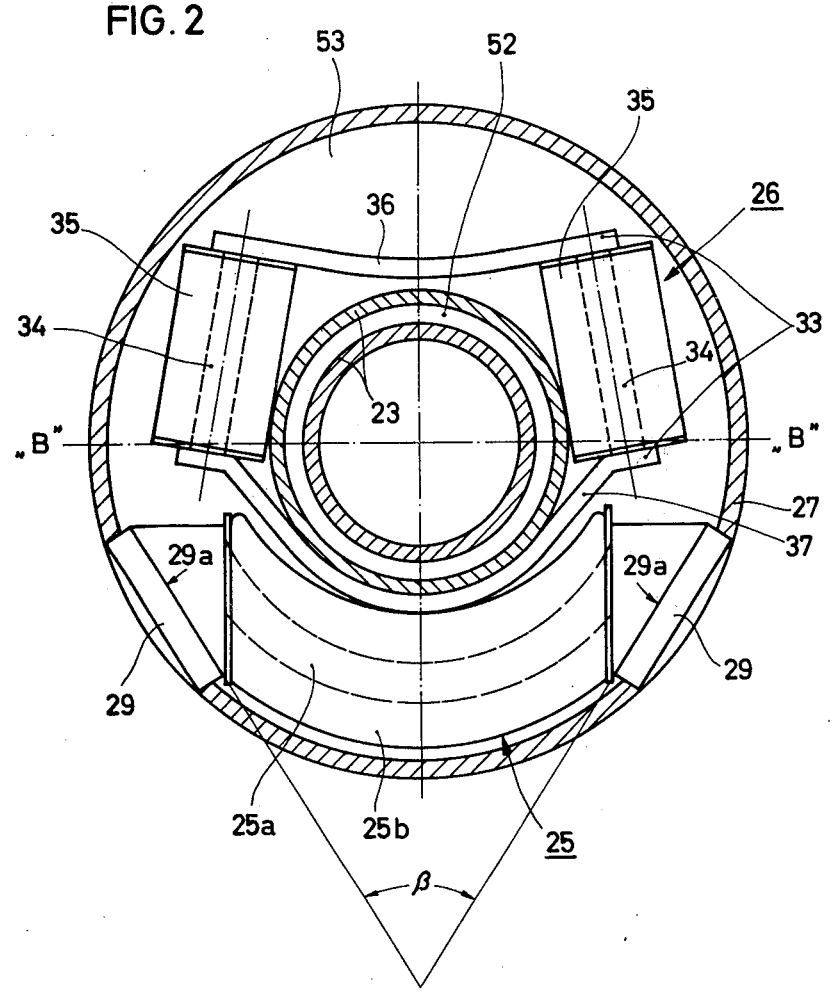
Figure 5:
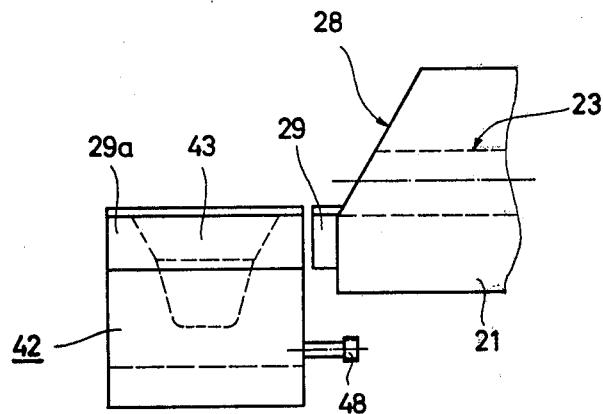
Figure 6:
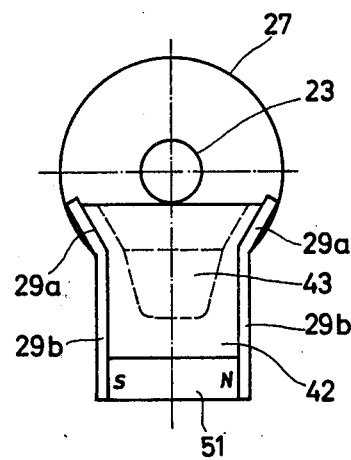

FIG. 1 is a longitudinal cross section taken through a complete electron gun in the customary operating position, i.e., with its axis horizontal, FIG. 2 is a cross sectional view taken through the object of FIG. 1 along line II—II, FIG. 3 is a side elevational view of a portion of the gun in conjunection with a rotatable vaporizing crucible having a plurality of cups, FIG. 4 is a front elevational view of the object of FIG. 3, partially in a cross section taken along line IV—IV of FIG. 3, FIG. 5 is a side elevational view like FIG. 3, but with a fixed vaporizing crucible provided with a deflection system of its own, and FIG. 6 is a front elevational view of the object of FIG. 5.

In FIG. 1, 10 represents a cathode which is fastened into the terminal posts 11. From the terminal posts 11, conductors 11, the rest of whose course is not shown, lead to screw binding posts 12 which can be connected to high-voltage connections, which are not shown, for the acceleration voltage and the current for heating cathode 10. The cathode is surrounded by a beam forming electrode 13 (Wehnelt cylinder) which is at the same potential; cathode 10 and beam forming electrode 13 are fastened in a conventional and therefore not further described manner to a high voltage insulator 14 which has a cooling body 15 at its extremity facing the screw binding posts 12. The screw binding posts 12, the cooling body 15 and a substantial portion of the length of the high voltage insulator 14 are surrounded by a shield 16.

The high voltage insulator 14 has a flange 17 which is joined, with the interposition of a vacuum seal not further indicated, to an annular flange 18 to which the shield 16 is also fastened. The annular flange 18 is joined by a barrel 19 to an internal flange 20 which serves for the mounting of the assembly 21 which is to be described further on. The internal flange 20 is at ground potential and has on its interior an accelerating anode 22 which is also replaceably mounted with the interposition of gaskets. The arrangement described thus far is rotationally symmetrical with the longitudinal axis "A" of the electron gun.

The assembly 21 consists of a beam guiding tube 23, an electromagnetic lens 24, an x-axis deflection system 25, and a y-axis deflection system 26, of which, however, only the upper pole shoe is visible in the drawing. The beam guiding tube 23 is surrounded by a coaxial envelope tube 27, the electromagnetic lens 24 and the deflection systems being disposed in the annular space 53 between the beam guiding tube and the envelope tube 27.

The beam guiding tube 23 and the envelope tube 27 are joined together in a vacuum-tight manner at the end remote from the cathode 10 by an end plate 28. The x-axis deflection system 25 consists of a yoke 25a on which there is provided a deflection coil 25b. The yoke 25a is joined at both ends to pole shoes 29 of which, however, only the rear one is visible in FIG. 1.

The end plate 28 is given a rearward inclination toward the cathode 10 from the pole shoes 29 of the x-axis deflection system, as is clearly shown in FIG. 1. In this manner the upper portion of the peripheral edge of the end plate 28 is set farther back than the lower portion of the peripheral edge, so that heat radiation and vapor particles emitted from a vaporizing crucible adjacent the pole shoes 29 are no longer able to impinge upon the end plate 28. The inclination of the end plate 28 from the axis "A" of the beam guiding tube is indicated in FIG. 1 by the angle "α", which in the present case amounts to 60°.

The beam guiding tube 23 is of jacketed construction, a coolant such as water, for example, being circulated in the cooling chamber 52. The connection to a cooling water circuit is provided through distribution passages 30 and bores 19a in the barrel 19 and connecting tubes 31 of which only one is shown in the drawing. The electrical connections of the deflection systems 25 and 26 and of the electromagnetic lens 24 are made through a multiple-pin connector 32 and a bore 19b in another portion of the barrel 19.

In FIG. 2, parts that are the same as those in FIG. 1 bear the same reference numbers. It can be seen that the yoke 25a, the induction coil 25b and the pole shoes 29 of the x-axis deflection system are disposed on one side of the plane of symmetry B-B passing through the beam guiding tube, i.e., below said plane of symmetry. By this arrangement, no stray fields are produced whereby the electron beam might be prematurely deflected on its way through the interior of the beam guiding tube 23. It can furthermore be seen that the surfaces 29a of pole shoes 29, from which the lines of force emerge, are disposed parallel to tangents of the jacket tube 27 and enclose an angle "β" equal to 60°. In this manner a keg-shaped field of magnetic lines of force is produced, which causes a strong deflection of the electron beam, plus, at the same time, an additional focusing action. The outside surfaces of the pole shoes 29 are flush with the outside surface of the jacket tube 27, so that installation in circular vacuum vessel apertures is possible without disassembly of the pole shoes.

It can also be seen in FIG. 2 that the y-axis deflection system consists of a closed ferromagnetic frame 33 surrounding the beam guiding tube 23, induction coils 35 being provided one on each of the two cores 34 aligned substantially perpendicularly to the x-axis deflection system, and that frame members 36 and 37 are disposed between the said induction coils 35. These frame members are of such a configuration that they project towards the orifice of the beam guiding tube 23, i.e., perpendicularly to the plane of the drawing, and therefore in a manner which cannot be seen in FIG. 2, the length of the projections, which form the pole shoes, being coordinated with the slope of the end plate 28. It can easily be seen in FIG. 2 that the special configuration of the x-axis deflection system 25 in conjunction with that of the y-axis deflection system 26 permits an optimum utilization of space.

In FIG. 3, which represents a side elevation of a portion of the gun, namely the gun orifice, the assembly 21 can be seen together with the beam guiding tube 23 which is represented in broken lines. The electron beam emerging from the gun orifice is marked 40; it is deflected on a curved path by the pole shoes 29, towards a vaporizing system 41 which consists of a water-cooled, rotatable vaporizing crucible 42 having a plurality of cups 43. The vaporizing crucible 42 is rotatable about a vertical axis 44, so that each of the cups 43 can be brought into the path of the electron beam 40. The vaporizing crucible 42 is disposed on a shaft 45 which is brought through a vacuum vessel 47 by means of a rotary seal 46. One of the two cooling water connections is indicated at 48.

A water-cooled copper shield 49, of which only the upwardly flaring conical aperture 50 and one of the cooling water connections 51 can be seen in FIG. 3, is suspended between the pole shoes 29. This shield serves as a splash guard against the vaporization materials contained in the cups 43 and as a means of capturing a portion of the reflected electrons. As best seen in FIG. 3, the special position of the end plate 28 reliably prevents the impingement of vapor particles or electrons upon the gun orifice. Likewise, the expansion of the vapor lobe is not interfered with.

In FIG. 4 it can be seen that the shield 49 is provided with sloping outside walls so that it can be inserted downwardly between the tangentially disposed pole shoes making broad-surface contact therewith. It is also possible, however, to suspend a vaporizing crucible between the pole shoes instead of the shield 49 shown in FIGS. 3 and 4; in this case, of course, the crucible will not be rotatable. Directions for such an alternative are set forth in FIGS. 5 and 6.

In FIGS. 5 and 6 the method of representation is similar to FIGS. 3 and 4. In this case, however, the pole shoes 29 are of shorter construction. Their prolongation consists of ferromagnetic side portions 29a, which are associated with a vaporizing crucible 42 and are affixed thereto. The ferromagnetic side portions extend downwardly through the pole pieces 29b between which a permanent magnet 51 is disposed. The side portions 29a, the pole pieces 29b and the permanent magnet 51 constitute an additional magnetic deflection system for an improved guidance of the beam in the vicinity of the crucible 42. It is also possible to provide a bottom aperture in the vaporizing crucible, through which the vaporizing material in rod form, for example, is fed accordingly as it is consumed.

What is claimed is:

1. In an electron gun for heating, melting and vaporizing purposes having electron-emitting cathode means, at least one beam-forming electrode means associated with the cathode means, accelerating anode means, electromagnetic lens means and beam guiding-tube means extending in the direction of the beam path and surrounded by electromagnetic deflection systems for x-axis deflection and for y-axis deflection, envelope tube means disposed outside of the deflection systems and being joined at its extremity to the end of the beam guiding tube means by end plate means through which pole shoe means of the x-axis deflection system are brought, the improvement which comprises inclining the end plate means towards the cathode means beginning from the pole shoe means of the x-axis deflection system.

2. Electron gun of claim 1 wherein the angle of inclination "α" of the end plate means with respect to the axis of the beam guiding tube means amounts to from 30° to 80°, preferably from 45° to 70°.

3. Electron gun of claim 1 wherein yoke means, deflection coil means and pole shoe means of the x-axis deflection system are disposed on one side of a plane of symmetry passing through the beam guiding tube means.

4. Electron gun of claim 3 wherein the surfaces of the pole shoe means from which the lines of force emerge are disposed parallel to tangents of envelope tube means and enclose an angle between 20° and 90°, preferably between 45° and 70°.

5. Electron gun of claim 1 wherein the y-axis deflection system includes closed ferromagnetic frame means surrounding the beam guiding tube means, with two core means disposed substantially perpendicularly to the x-axis deflection system induction coil means disposed on said core means, and frame means located between the induction coil means and constructed so as to project towards the orifice of the beam guiding tube means, the length of the projections, which form the pole shoe means, being coordinated with the slope of the end plate means.

6. Electron gun of claim 1 wherein the beam guiding tube means is double-walled and the cavity thereof is provided with connections for a cooling medium.

7. Electron gun of claim 1 wherein vaporizing crucible means is suspended into the pole shoe means with broad-surface contact.

8. Electron gun of claim 1 wherein vaporizing crucible means is provided with ferromagnetic side portions which are constructed and disposed such that they form the prolongation of the pole shoe means of the electron gun, and permanent magnet means is disposed between the side portions.

* * * * *